United States Patent [19]

Nishizawa et al.

[11] Patent Number: 4,506,281

[45] Date of Patent: Mar. 19, 1985

[54] GAAS SEMICONDUCTOR DEVICE

[75] Inventors: Jun-ichi Nishizawa; Tadahiro Ohmi, both of Komegafukuro Sendai, Japan

[73] Assignee: Semiconductor Research Foundation, Japan

[21] Appl. No.: 295,816

[22] Filed: Aug. 24, 1981

Related U.S. Application Data

[63] Continuation of Ser. No. 35,460, May 3, 1979, Pat. No. 4,320,410.

[30] Foreign Application Priority Data

May 8, 1978 [JP] Japan .................................. 53-54270

[51] Int. Cl.$^3$ ............................................. H01J 27/02
[52] U.S. Cl. ........................................ 357/43; 357/42; 357/22; 357/41
[58] Field of Search ................ 357/22 E, 43, 42, 22, 357/41

[56] References Cited

U.S. PATENT DOCUMENTS 4,320,410  3/1982  Nishizawa et al. .................. 357/22
4,338,618  7/1982  Nishizawa ............................ 357/22
4,434,433  2/1984  Nishizawa ............................ 357/22

Primary Examiner—Martin H. Edlow
Attorney, Agent, or Firm—McGlew and Tuttle

[57] ABSTRACT

This invention relates to a GaAs semiconductor device and more particularly to a GaAs static induction transistor integrated circuit which operates at a very high speed. Gallium arsenide has the features that the mobility of electrons is higher than that in silicon and that the band structure has a direct gap. The mobility of electrons in gallium arsenide is several times as high as that in silicon; this is very suitable for the manufacture of a semiconductor device of high-speed operation. Further, since gallium arsenide has the direct gap, the electron-hole recombination rate is high and the minority carrier storage effect is extremely small. By causing the recombination at the direct gap, light emission can be achieved more efficiently. Accordingly, a light receiving and emitting semiconductor device can be obtained through the use of gallium arsenide. As the propagation velocity of light is very fast, signal transfer between semiconductor chips can be achieved at ultra-high speed. By combining this with the high mobility of electrons in gallium arsenide, an ultra-high speed logical operation device can be realized.

5 Claims, 19 Drawing Figures

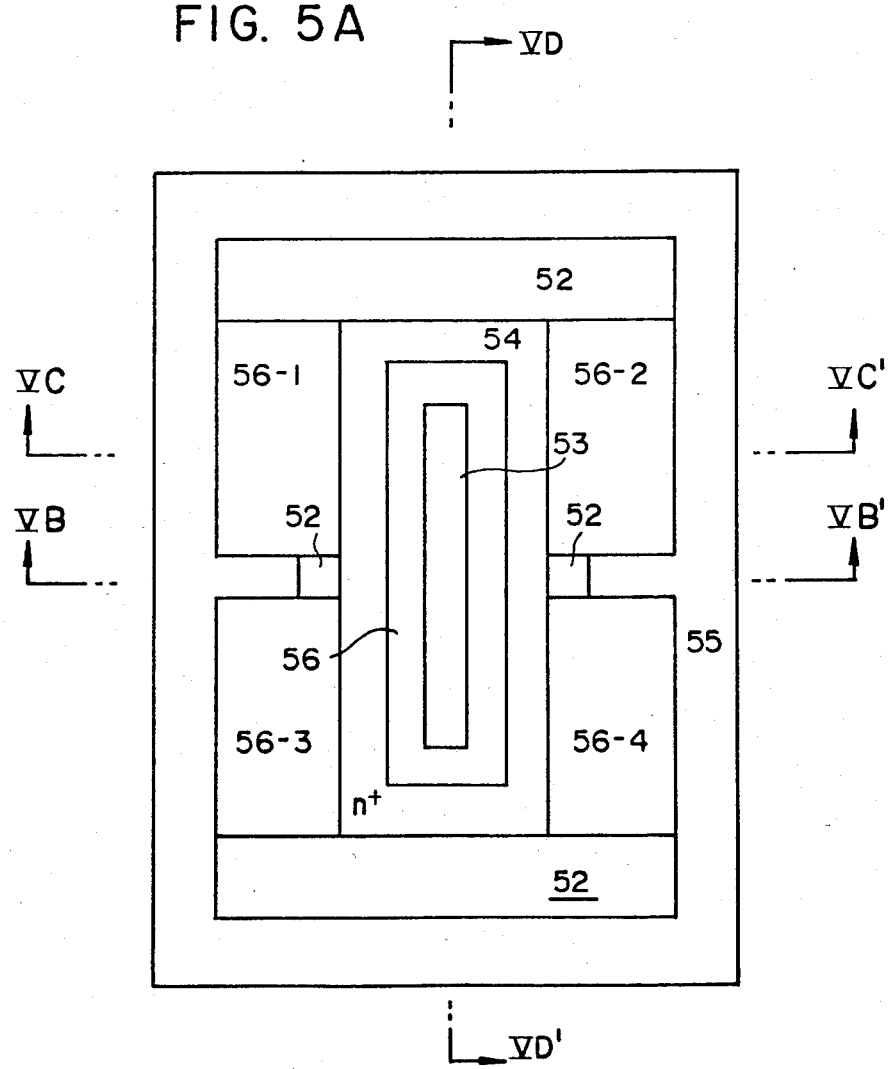

FIG. 5B
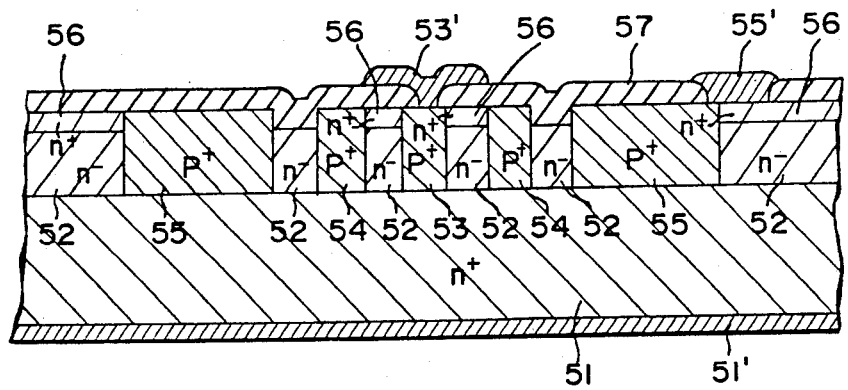
FIG. 5C
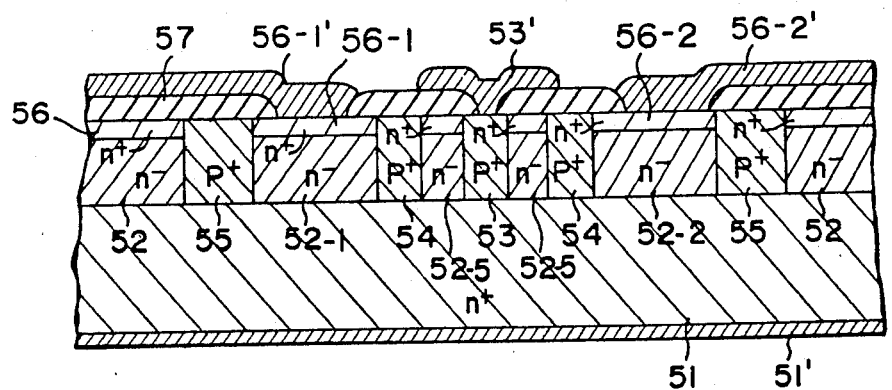
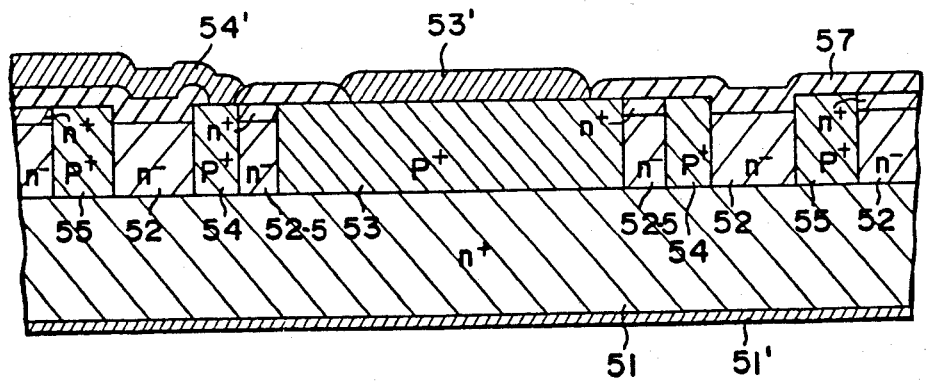
FIG. 5D

GAAS SEMICONDUCTOR DEVICE

This is a continuation of application Ser. No. 35,460 filed May 3, 1979 now U.S. Pat. No. 4,320,410.

BACKGROUND OF THE INVENTION

1. Field of the Invention

This invention relates to a GaAs semiconductor device, and more particularly to a semiconductor device employing an inversely configured (inversely operated) GaAs static induction transistor.

2. Description of the Prior Art

An $I^2L$ equivalent logic circuit (hereinafter referred to as SITL) employing an inversely configured static induction transistor (hereinafter referred to as SIT) has already been produced using silicon, by way of example and, as a result of this trial production, a minimum delay time of 3.5 msec and a value 2 fj in terms of the product of power and delay has been obtained. In view of the availability of desired materials and the degree of development of the manufacturing process for the fabrication of LSL's, the SITL will still be formed mainly of silicon in future. In the case of very high-speed logical operations being required, however, it will be necessary to form the SITL of a material of high mobility of carriers. A material of high mobility of carriers from which excellent quality is obtainable in a relatively stable manner and wherein the process for the manufacture of the SITL has been developed to some extent, is gallium arsenide except. But the manufacturing process for the GaAs semiconductor device is more inferior to the manufacturing process using silicon and more difficulties are encountered in the manufacture of a semiconductor device of a desired configuration.

SUMMARY OF THE INVENTION

An object of this invention is to provide a GaAs static induction transistor integrated circuit which operates at a very high speed.

Gallium arsenide has the features that the mobility of electrons is higher than in silicon and that the band structure has a direct gap. The mobility of electrons in gallium arsenide is several times as high as that in silicon. This is very suitable for the manufacture of a semiconductor device of high-speed operation. Further, since gallium arsenide has the direct gap band structure, the electron-hole recombination rate is high and the minority carrier storage effect is extremely small. By causing the recombination at the direct gap, light emission can be achieved more efficiently. Accordingly, a light receiving and emitting semiconductor device can be obtained through the use of gallium arsenide. As the propagation velocity of light is very fast, signal transfer between semiconductor chips can be achieved at ultra-high speed. By combining this with the high mobility of electrons in gallium arsenide, an ultra-high speed logical operation device can be realized.

It is mainly due to poor manufacturing processes that has retarded the development of the GaAs semiconductor device in spite of its excellent features. Of the manufacturing techniques for the GaAs device, the epitaxial growth method has appreciably been developed. Accordingly, it is preferred to employ a structure which enables the most efficient use of the epitaxial growth method.

In accordance with an aspect of this invention, as $n^-$ type high resistance epitaxial region and an $n^+$ type low resistance epitaxial region are formed in layers on an $n^+$ type GaAs substrate and a semiconductor device is formed effectively utilizing these two n type regions. In some cases, these $n^+$, $n^-$ and $n^+$ layer are sequentially formed on a $p^-$ GaAs substrate or semi-insulating GaAs substrate.

In the case of using silicon, a silicon dioxide ($SiO_2$), i.e. an excellent passivation film is formed by natural oxidation but, in using gallium arsenide, no excellent passivation film has been developed. An electrically excellent insulating film of low surface state density is mechanically weak and poor in adhesion; but a mechanically strong insulating film of good adhesion induces high surface state density and presents problems in electrical properties.

Recently one of the present inventors and another researcher have discovered that a gallium oxynitride film becomes an excellent passivation film for gallium arsenide (Japanese Patent Applications Nos. 38580/78 and 86573/78). A $GaO_xN_y$ film having a small molar ratio between oxygen and nitrogen (less than 0.3, preferably less than 0.2), formed on the GaAs surface, has very small surface state density and is very excellent as an insulating film of the GaAs semiconductor device. Further, a $GaO_xN_y$ film whose oxygen-nitrogen molar ratio is increased (more than 0.2, preferably more than 0.3) as the distance from the interface between the film and the GaAs surface increases, exhibits small surface state density and excellent performances in adhesion and in mechanical strength.

In accordance with another aspect of this invention, the $GaO_xN_y$ film of varying oxygen-nitrogen molar ratio is used as the passivation film to provide an excellent GaAs semiconductor device. A GaAs diode serves as an excellent light emitting or receiving element, as is known from a light emitting diode.

In accordance with a further aspect of this invention, a diode action as a light emitting or receiving element is incorporated in an integrated semiconductor device to permit signal transfer between individual circuits or semiconductor chips by a light signal.

According to an embodiment of this invention, there is provided a GaAs semiconductor device which comprises an $n^+$ type GaAs substrate having a first main surface, an $n^-$ type GaAs epitaxial layer disposed on the first main surface and having a second main surface, a thin $n^+$ type GaAs epitaxial surface layer disposed on at least one part of the second main surface of the $n^-$ type GaAs epitaxial layer and having a third main surface, a first $p^+$ type GaAs region substantially surrounding the $n^-$ type GaAs epitaxial layer and a first part of the $n^+$ type GaAs epitaxial surface layer, the width of the $n^+$ type region surrounded by the $p^+$ type GaAs region being selected so that the $n^-$ type region is sufficiently pinched off by a depletion layer owing to a diffusion potential of a $p^+n^+$junction, a second $p^+$ type GaAs region contiguous to the adjacent first $p^+$ type region through a second part of the $n^+$ type epitaxial layer, a gallium oxynitride film formed on the second part of the $n^-$ type epitaxial layer and having an oxygen-nitrogen molar ratio of less than 0.3 in the neighborhood of the interface between the film and the $n^-$ type epitaxial layer, a first conductive electrode formed on the gallium oxynitride film, and a second conductive electrode making an ohmic contact with the first $p^+$ type GaAs region and electrically connected with the first conductive electrode. In this embodiment, a vertical n channel GaAs static induction transistor and a lateral p channel GaAs insulated electrode field effect transistor are integrated and the drain of the lateral GaAs field effect transistor is merged into the gate of the vertical static induction transistor, thereby forming an I²L equivalent unit.

BRIEF DESCRIPTION OF THE DRAWINGS

FIG. 5 illustrates an embodiement of an I²L type SITL of this invention (a one-input four-output unit) which employs a splitted gate structure, FIG. 5A being a plan view and FIGS. 5B, 5C and 5D sectional views respectively taken on the lines VB—VB', VC—VC' and VD—VD' in FIG. 5A;

DESCRIPTION OF THE PREFERRED EMBODIMENTS

With reference to the drawings, the present invention will hereinafter be described in detail.

Figure 1A:
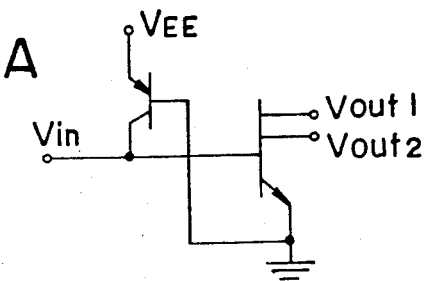
FIG. 1 illustrates an embodiment of an I²L type GaAs SIT inverter (one-input two-output) of this invention which employs a bipolar transistor as a load, FIG. 1A being an equivalent circuit, FIG. 1B a plan view and FIG. 1C a sectional view taken on the line 1C—1C' in FIG. 1B.
Figure 1B:
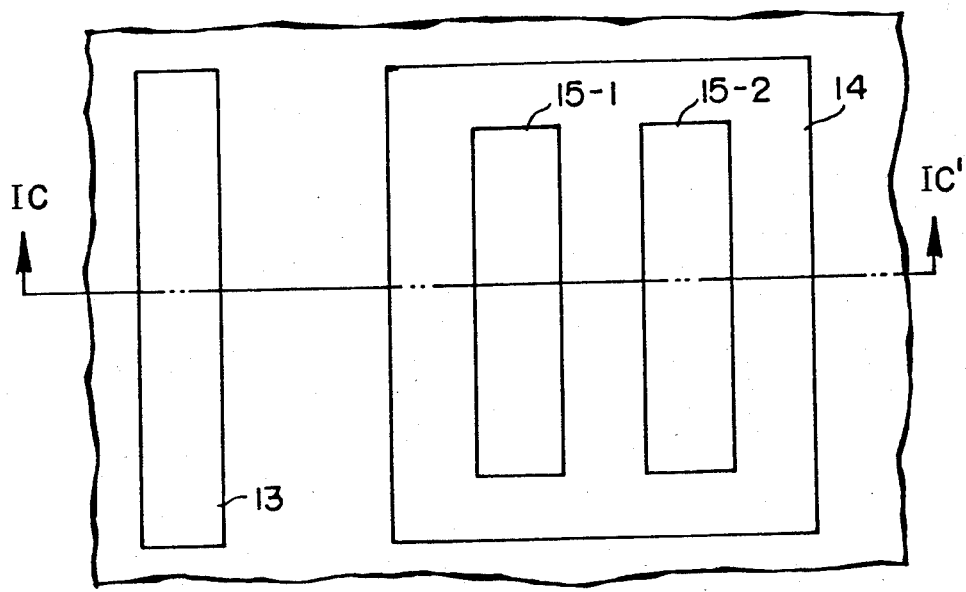
Figure 1C:
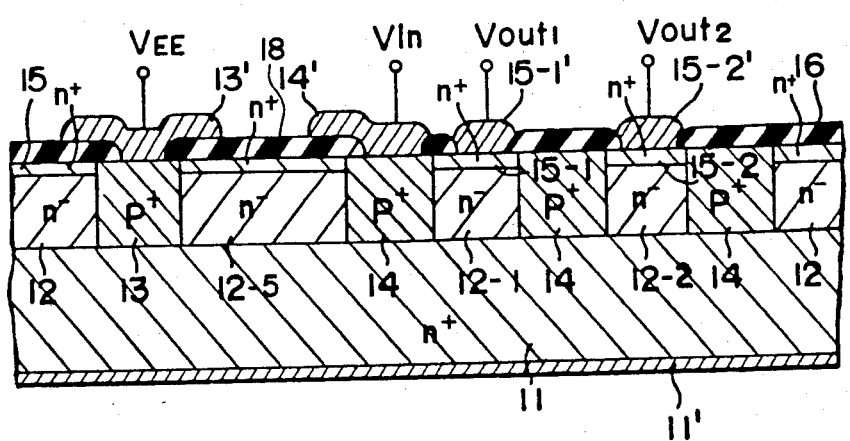

FIG. 1A illustrates a one-input two-output I²L equivalent SITL inverter circuit which employs an SIT as a driving transistor and a bipolar transistor as a load transistor. FIG. 1B is a plan view of a specific operative example of the inverter circuit of FIG. 1A and FIG. 1C is a sectional view taken on the line IC—IC' in FIG. 1B. In FIG. 1C, reference numeral 11 indicates an n+ GaAs substrate; 12 designates n− regions formed on the substrate 11 through utilization of epitaxial growth techniques; and 15 identifies n+ regions similarly formed by the epitaxial growth method to overlie the n− regions 12. That is, there are formed by the epitaxial growth method on an n+ GaAs substrate 11 the n− and n+ layers 12 and 15 of predetermined thicknesses and impurity concentrations so that the n− layers 12 respectively underlie the n+ layers. Further, in this wafer there are formed in predetermined areas p+ regions 13 and 14 which are formed by diffusion or ion implantation from the surface of the n+ surface layer 15. The n+ type region 11 constitutes a source region of the driving SIT and the n− region 12 forms a channel region of the driving SIT and a base region of the bipolar transistor (hereinafter referred to as BJT) for load use. The p+ type region 13 serves as an emitter region of the BJT and the p+ type region 14 forms a common region which serves both as a collector region of the BJT and a gate region of the SIT. The n+ regions 15-1 and 15-2 respectively form drain regions of the SIT. Reference numerals 11', 13', 14', 15-1' and 15-2' indicate electrodes. Ohmic contact electrodes of the p+ regions are formed on InAg, AgZn or the like and ohmic contact electrodes of the n+ regions are formed of AuGe, AuGeNi or the like. In this case, it is also possible to deposit another metal on the ohmic contact electrodes. Reference numeral 16 designates an insulating layer, which is formed, for example, of $SiO_2$ or $Si_3N_4$ by sputtering or a CVD method, $Al_2O_3$ by sputtering or $GaO_xN_y$ by the CVD method, or a combination of them. Especially in the case requiring an insulating layer of low surface states, it is desirable that a $GaO_xN_y$ film with a molar ratio between O and N (hereinafter referred to as the ON ratio) should be less than 0.3, at least in the neighborhood of the interface of the wafer. For enhancement of the adhesion and the mechanical strength of the insulating layer, it is preferred to increase the abovesaid molar ratio in the insulating film from the interface. The gate to gate spacing (hereinafter width) and the impurity concentration of the n− channel region of the SIT for driving use are selected such that the channel is completely pinched off only with a diffusion potential between the p+ gate region and the n− channel region to hold the SIT in a cut-off state. Where the impurity concentration of the p+ region is about $10^{18}$ to $10^{20}$ cm$^{-3}$, a depletion layer extends mostly on the side of the n− channel region only. When impurity concentration of the n− region is $1 \times 10^{14}$ cm$^{-3}$ and $1 \times 10^{15}$ cm$^{-3}$, the diffusion potential is about 1.2 and 1.27 V in the case of the GaAs semiconductor device.

Accordingly, in the cases where the impurity concentration of the channel is, for example, $1 \times 10^{14}$ cm$^{-3}$ and $1 \times 10^{15}$ cm$^{-3}$, if the channel width is selected to be smaller than about 5.0 and 1.58 μm, the channel is in a cut-off state at a zero gate bias; namely, a normally off SIT is obtained. It has been found that the standard of selection of the impurity concentration $N_D$ and the width 2a of the channel region is $N_D(2a)^2 < 2.5 \times 10^{15}$ cm$^{-3}$, where $N_D$ is in cm$^{-3}$ and 2a in μm. As the distance between the source and the drain region decreases, the abovesaid value, $N_D(2a)^2$, must be further reduced gradually. If the distance l between the source and the drain region is too short as compared with the channel width 2a, however low the impurity concentration is selected, the cut-off state of the channel cannot be achieved under ordinary operative conditions. In order to provide a potential barrier of a certain height for preventing no current from flowing even if a certain drain voltage is applied, the ratio, l/2a, must be larger than at least 0.5. In a pnp type bipolar transistor, it is desirable that the spacing between the p+ type regions 13 and 14 (the length of the base region) is selected so that holes injected into the base region from the emitter region are not quenched by recombination. In other words, it is preferred that the length of the n− region between p+ regions 13 and 14 which does not become a depletion layer but retains electrons (a non-depleted base region) is selected to be smaller than the diffusion length of the holes. Assuming, for instance, that the hole mobility is about 350 cm$^3$/V·sec and that the lifetime of holes is about 10 nsec, the diffusion length ld of the holes in the GaAs is approximately 3 μm. Therefore, the spacing between the p+ type regions 13 and 14 (the length of the base region) is selected to be the following value or smaller:

$$\sqrt[2]{\frac{2\epsilon V_{bi}}{N_D e}} + \text{ld}$$

where $N_D$ is the impurity concentration of the n− type region, e is a unit charge, $\epsilon$ is the dielectric constant of the semiconductor and ld is the diffusion length of the hole.

For example, if the impurity concentration $N_D$ of the n− type region is between $1 \times 10^{14}$ cm$^{-3}$ and $1 \times 10^{15}$ cm$^{-3}$, the spacing between the emitter and the collector is smaller than about 11μm and 5.5 μm respectively. It is also possible to constitute a punch through bipolar transistor as a load transistor is which the non-depleted base region is removed to provide a punch through state between the emitter and the collector.

In FIG. 1A, reference character $V_{EE}$ indicates a power source voltage; Vin designates an input voltage; and Vout1 and Vout2 identify output voltages. The value of the power source voltage $V_{EE}$ is selected such that appreciable forward current does not directly flow between the p+ region 13 and the n+ region 11. The impurity concentration of the n+ region 11 is usually $1 \times 10^8$cm$^{-3}$ or more; therefore, a diffusion potential between the p+ and n+ type regions 13 and 11 ranges from about 1.4 to 1.5 V. The power source voltage $V_{EE}$ is selected, for instance, in the range from 1.0 to 1.3 V. Of course, it may also be lower than this value. The impurity concentration in the n+ region 11 is desired as high as possible to improve the performance of the driver SIT, such as low impedance, high transconductance and so on, as far as the quality of the semiconductor crystal can be reached. When the input voltage Vin to the gate is at a low level (for example, 0.1 to 0.3 V), the driver SIT is in its cut-off state, so that the output voltage Vout is at a high level (for example, approximately 0.8 to 1.2 V). In this case, a current supplied from the BJT for load use flows via an input terminal Vin to the drain of a driver SIT of a preceding stage (not shown). When the input voltage Vin is switched to a high level, the driver SIT becomes conductive to lower the output voltage Vout to a low level; namely an inverter operation is accomplished. When the gate voltage rises to a high level, a potential barrier set up in the channel is reduced or removed and, simultaneously therewith, injection of electrons from the source region is promoted by the space charge effect of holes injected from the gate region, permitting a flow of a large current even if the channel area is small. In other words, a large output current can be rapidly controlled with a small signal current; this is one of the causes of high-speed operation of the SITL.

The mobility of electrons in gallium arsenide is about five times as high as that in silicon. Accordingly, even if carriers of the same number exist as a result of application of the same voltage between the source and drain, a current in the GaAs SIT is several times larger than that in the Si SIT corresponding to the above said higher mobility. That is, in the GaAs SIT the same current as flowable in the Si SIT can be obtained with the channel area about 1/5 or 1/6 that of the latter. If the channel area can be reduced, then the gate structure surrounding the channel can also be made small, by which the electrostatic capacity of the gate is decreased to enable a high-speed operation. To cut off the SIT in its operative state, the gate is made low-level and, at this time, the storage time of minority carriers or holes injected into the channel limits the cut-off speed. Since gallium arsenide has a band structure of direct transistion, the electron-hole recombination time is short and the storage time of the minority carriers is short in GaAs. Consequently, the cut-off time can also be shortened, permitting the GaAs SIT to perform a very high-speed operation. First portions 12-1 and 12-2 of the intermediate layer 12 underlie portions 15-1 and 15-2 of the surface layer. Second portion 12-5 of the intermediate layer 12 underlies a portion of the surface layer 15 and an insulated layer 18.

Figure 2:
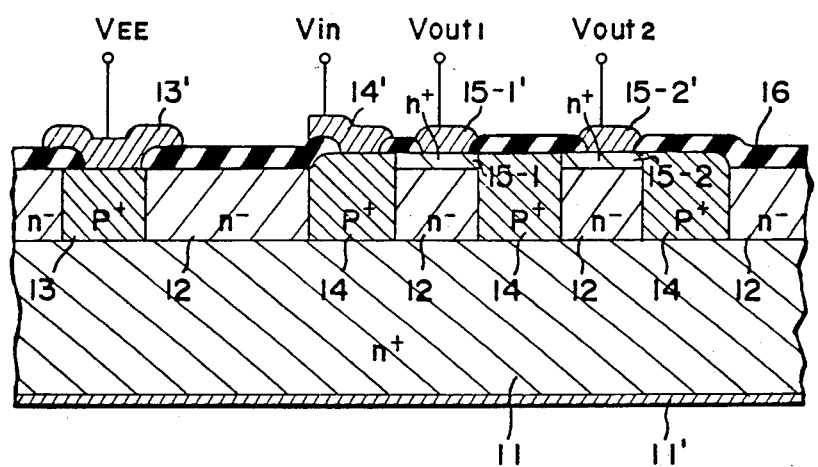
FIG. 2 shows in section another embodiment of the I²L type GaAs SIT inverter.
Figure 3:
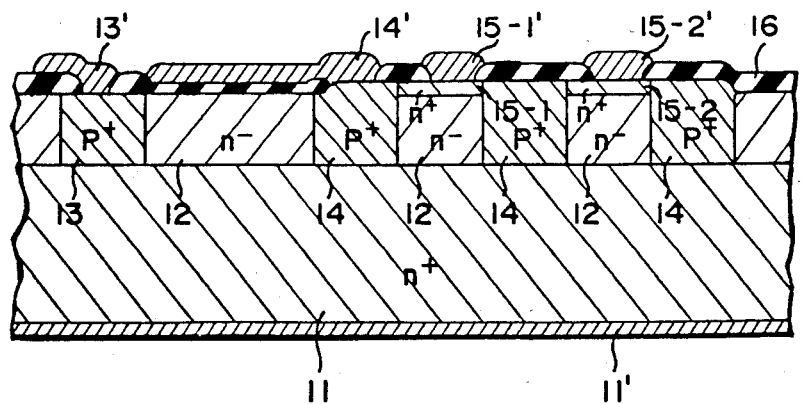
FIG. 3 shows in section another embodiment of the I²L type GaAs SIT inverter of this invention which employs an IGFET as a load.

The n+ layers, except 15-1 and 15-2 which ultimately serve as the drains of the driving SIT, need not be formed. FIG. 2 shows another example of the one-input two-output SITL inverter in which such unnecessary n+ surface layers are not grown by selective growth or selectively removed by etching. FIG. 3 shows an example which employs, as the load transistor an IGFET in which such n+ layers are removed. An insulating layer interposed between an electrode 14' and the n−− region 12 is formed thin so as to create an inversion layer in the surface of the n− region 12. A gate insulating film of a GaAs IGFET is required to be of few surface states, so that a GaOxNy film having an O/N ratio of less than 0.3 by the CVD method is excellent as such a gate insulating film. A GaOxNy film having an O/N ratio of about 0.1 to 0.2 is formed directly on the surface of a semiconductor and, in this case, it is preferred to gradually decrease the O/N ratio as the semiconductor surface is approached, since the strength of the film is enhanced. In the illustrated examples, the gate electrode and the drain region are directly interconnected (or short-circuited); but it is possible, of course, to provide a depletion mode FET in which the gate is directly connected to the source or to apply a predetermined potential for operation.

In FIGS. 1 to 3, the p+ region is shown to reach the n+ region (the substrate) but the p+ region need not always extend down to the n+ region or on the other hand, it may extend down into the n+ region.

The fabrication processes of the GaAs semiconductor device are still unsatisfactory. But in multilayer epitaxial growth, whether it is vapor or liquid growth, the thickness and the impurity concentration of each layer are controlled with appreciably high reproducibility. With such multilayer epitaxial growth techniques, it is easy to form an n− layer having an impurity concentration, for example, of about $5 \times 10^{13}$ to $5 \times 10^{15}$cm$^{-3}$ to a thickness, for example, of 0.5 to about 4.0 μm on an n+ substrate and form thereon an n+ layer having an impurity concentration of about $10^{17}$ to $10^{18}$cm$^{-3}$ to a thickness, for example, of about 0.1 to 1.0 μm. Needless to say, the thicknesses and the impurity concentrations of the respective layers are not limited specifically to the abovesaid values. It is preferred in the GaAs semiconductor device to employ such multilayer epitaxial growth techniques as effectively as possible. The selective formation of the p+ regions is achieved by, for example, diffusion of zinc. In the present manufacture of the GaAs semiconductor device, the diffusion of zinc is substantially only one stable diffusion process. In the case where during the zinc diffusion process arsenic in the GaAs crystal escapes therefrom so as to degrade its crystal quality, then if a vapor pressure of arsenic is applied so as to prevent such escape of arsenic during the diffusion, then zinc can be diffused without degarding the crystal (Conf. H. Otsuka, K. Ishiba and J. Nishizawa, "Annealing of n type GaAs under excess arsenic vapor", Jap. J. Appl. Phys. Vol. 8, p. 632, 1969, and J. Nishizawa, H. Otsuka, S. Yamakoshi and K. Ishida, "Non-stoichiometry of Te doped GaAs", Jap. J. Appl. Phys. Vol. 13, p. 46, 1974). The selective formation of the p+ regions can also be carried out by ion implantation of cadmium or beryllium. In some cases, the n+ layers in the surface of the semiconductor may also be formed by ion implantation or diffusion of the Group VI elements, such as S, Se, Te, etc. The n+ layers having an impurity concentration of about $10^{18} cm^{-3}$ and a thickness of 0.1 to 0.2 $\mu$m can be selectively formed by ion implantation of Se, for example. At present since there is not available an insulating layer which serves as an excellent diffusion mask, the p+ region can be formed by the ion implantation with higher accuracy rather than diffusion process. For the formation of the insulating layer, there is no highly reliable step like thermal oxidation of silicon; therefore, it is desirable to form the insulating layer of GaOxNy, $SiO_2$, $Si_3N_4$, $Al_2O_3$ or AlN, or a mixture of them. Even at such an undeveloped present stage of the fabrication techniques, however, the GaAs semiconductor devices of the arrangements shown in the above examples can be obtained by a combination of the fabrication techniques, as described above.

Figure 4A:
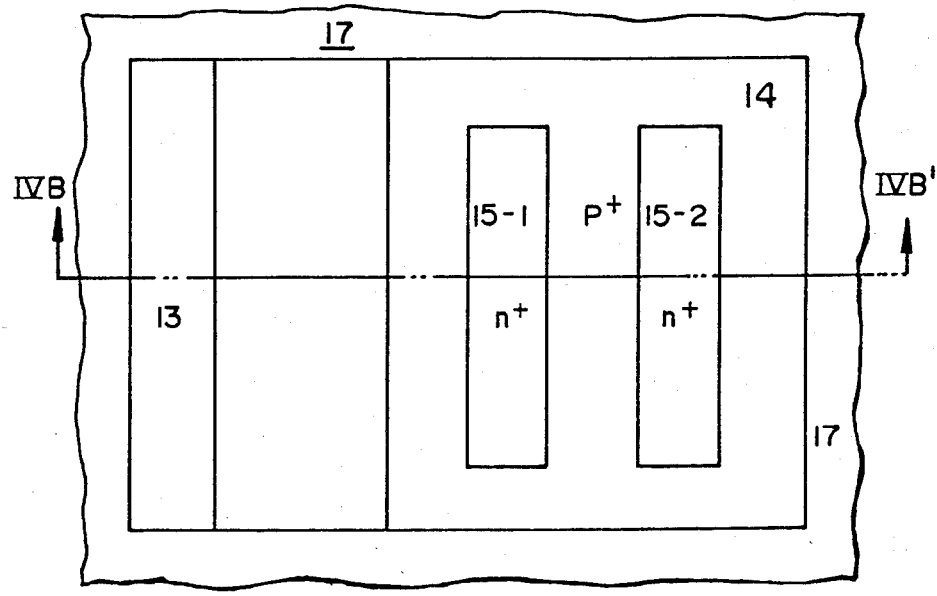
FIG. 4 illustrates another embodiment of this invention, FIG. 4A being a plan view and FIG. 4B a sectional view taken on the line IVB—IVB' in FIG. 4A.
Figure 4B:
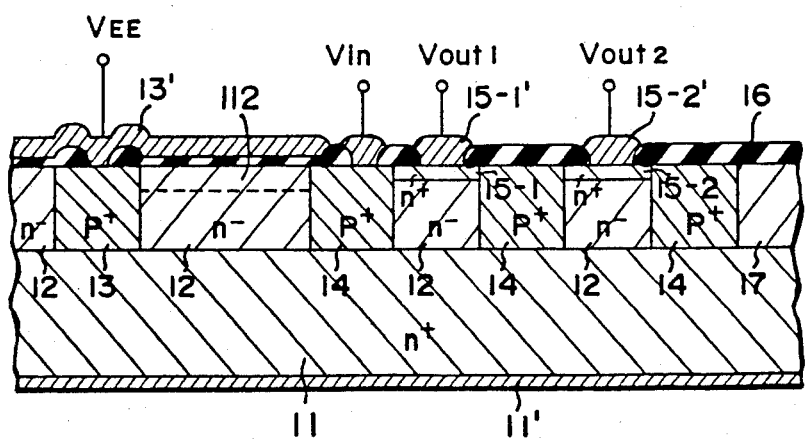

In the examples shown in FIGS. 1 through 3, holes may in some cases be injected from the p+ gate region 14 of the driver SIT to the surrounding regions. By preventing such unnecessary hole injection, an undesirable injection of minority carriers is avoided to provide for enhanced current gain of the driver SIT, speeding up its operation. To this end, it is possible to etch away the boundary portion of the gate region of the driving SIT and to fill therein an insulating material; but, since it has been found that gallium arsenide is made of high-resistivity material by irradiation with protons, the use of such a process is effective. FIGS. 4A and 4B illustrate an example of a structure which is the same as shown in FIGS. 1B and 1C but in which the surrounding portion of the gate region is made high-resistance (semi-insulating). FIG. 4A is a plan view of such a structure and FIG. 4B is a sectional view taken on the line IVB—IVB' in FIG. 4A. In this example, the p+ regions 13 and 14 are formed by implanting beryllium or cadmium ions into the n− epitaxial layer formed on the n+ substrate, and the n+, regions 15-1 and 15-2 are formed by implanting sulfur or selenium ions. The load transistor is formed as an insulated gate (IG) FET, which has an inversion layer 112 and operates in a depletion mode. The gate electrode of the IGFET is directly connected with the source electrode. The surounding portion of the inverter unit is rendered by proton irradition into a high resistance isolation region 17. On the left side of the p+ source region 13 of the IGFET there is formed another IGFET serving as a load transistor of another inverter unit. The insulating film overlying the n− region 12 and underlying the gate electrode is preferred to be the aforementioned CaOxNy film of a small O/N ratio at least adjacent to the surface. It is also possible to form the inverter units individually and to completely surround each of them with a semi-insulating isolation region. Also, it is possible to dope the channel region of the IGFET as by ion implantation to change its performance.

In gallium arsenide the electron-hole recombination rate is high and the lifetime of carriers is shorter than that in silicon and the minority carrier storage effect is small. In order that the minority carriers may effectively be injected only to the channel region and the minority carrier storage effect may be further decreased where the unnecessary minority carrier injection into the n− regions from the peripheral area of the gate region of the driver SIT is completely suppressed, it is effective to introduce a split gate structure proposed by the present inventors in their prior U.S. patent application Ser. No. 920,542 (based on Japanese Patent Application No. 154197/77 entitled "Static Induction Transistor and Semiconductor Integrated Circuit", Japanese Patent Application No. 156149/77 entitled "Static Induction Transistor Semiconductor Integrated Circuit" and Japanese Patent Application No. 157629 entitled "Semiconductor Integrated Circuit"). FIGS. 5A to 5D illustrate an example of a one-input four-output semiconductor device having the split gate structure.

FIG. 5A is a plan view of the semiconductor device and FIGS. 5B, 5C and 5D are sectional views respectively taken on the lines VB—VB', VC—VC' and VD—VD' in FIG. 5A. A lateral load bipolar transistor and a vertical driver SIT are formed on the inside of a non-driving gate region 55 and a bipolar transistor serving as a load transistor is formed centrally of the gate region 55. A p+ region 53 is an emitter region of the bipolar transistor, an n+ region 56 and n− regions 52 formed on the outside of the region 53 are a base region of the bipolar transistor and a p+ region 54 formed on the side of the region 56 is a collector region of the bipolar transistor. The collector region 54 of the bipolar transistor also serve as a driving gate for simultaneously controlling four channels of the SIT which is a driver transistor. n+ type regions 56-1, 56-2, 56-3 and 56-4 are drain regions respectively corresponding to the four outputs of the driver SIT. Below the n+ type drain regions 56-1, 56-2, 56-3 and 56-4 there are disposed the n− regions 52, each serving as a channel region and, on the outside thereof, there is disposed the p+ region 55 serving as a non-driving gate. The channels are each isolated from the others by forming the driving gate 54 and the non-driving gate 55 in close proximity and pinching off the n− type region 52 therebetween with a depletion layer. The n+ layer 56 overlying this isolating region 52 is not formed from the beginning or, after being formed, is etched away. A region 51 (a substrate) is a source region of the driven SIT and an emitter (injector) electrodes 53' and drain electrodes 56-1' and 56-2' are formed on the emitter region 53 and the drain regions 56-1 and 56-2 respectively. An electrode 55' (FIG. 5B) is formed to extend over the non-driving gate region 55 and the n+ layer 56, so that the p+ non-driving gate region is electrically connected to the n+ source region 51. An electrode 54' (FIG. 5D) on the driving gate 54 acts as an input terminal for receiving an input from a preceding stage. The p+ region 55 is the non-driving gate region defining the channel and, at the same time, functions as an isolation region between the individual units. Where holes are injected from the driving gate region 54 into the channel region 52, the non-driving gate region 55 is held at a lower potential for the holes to be extracted from them. Accordingly, in this structure there is substantially no minority carrier storage effect. As almost all of the holes injected from the driving gate region 54 have positive charges so they are effectively injected into the channel region 52, these holes serve to introduce electrons from the source region 51 into the channel region 52, resulting in increased current gain and drain current.

In the above embodiment, in the portion where the driving gate region 54 is close to the non-driving gate region 55, the holes injected therein mostly flow uselesly without serving to create a drain current. Accordingly, from the viewpoint of enhancement of characteristics of the semiconductor device, it is preferred to deeply etch away such a portion to thereby reduce an unnecessary hole injection. This may also be achieved by making such a portion semi-insulating through utilization of irradiation of protons. First portions 52-1 and 52-2 of the intermediate layer 52 lie under first portions 56-1 and 56-2 of the surface layer. Second portions 52-2 of the intermediate layer simularly lie under second portions of the surface layer 56.

With the split gate structure shown in FIGS. 5A to 5D, the electrostatic capacity of the driving gate is small and the current gain is not lowered so greatly and substantially no minority carrier storage effect is produced; therefore, a very high-speed operation is possible and the non-driving gate region acts as an isolation region, too. By forming side by side a plurality of such units as shown in FIG. 5 and obtaining wired logic, desired logic can be set up and the integration density is also very high.

Since the $I^2L$ equivalent SITL is capable of constituting wired logic, once such a basic inverter as depicted in FIG. 1 has been constructed, it is sufficient only to select output terminals of the inverter at desired values and to connect them to the inverter by wired coupling, in order to provide a circuit performing a desired function. The foregoing description has been given only of the embodiments employing an $n^+$ substrate but it is also possible to grow an $n^+$ layer on a p type substrate or semi-insulating substrate and then form the device of this invention. Even by making opposite the conductivity types of all the parts, a similar GaAs semiconductor device can also be obtained by the mobility of holes in gallium arsenide is much lower than the mobility of electrons; therefore, an element performing a high-speed operation is preferred to be arranged so that a main current is carried by electrons. A p type high purity region is rather difficult to form; and accordingly even in the case where holes carry a current, it is desirable to make such an arrangement that the holes migrate in an n type region or an inversion layer formed therein.

As the scale of an integrated circuit becomes large, the numbers of input and output terminals of a semiconductor chip greatly increase. At present, bonding pads are usually provided on the peripheral portion of the chip for external connections via metallic wires or tapes; however, an increase in the numbers of input and output terminals increases the total area occupied by the bonding pads, preventing enhancement of the integration density. Further, an increased number of bonding pads causes lowering of the yield and reliability of chips. Since gallium arsenide has a band structure of direct transition, a light emitting diode or injection laser of very high efficiency can be obtained. By forming thin $p^+$ regions of predetermined areas at those portions of the chip which will ultimately be occupied by input and output terminals and by applying a current in a forwardly biased condition, a light emitting diode of very high efficiency is provided, whereas by applying a reverse bias, a photo diode serving as a photo detector is obtained. In other words, information transfer between chips can be accomplished optically not electrically via a metallic wire. For efficiently leading light to the outside to focus the light on a predetermined position of another chip, it is also possible to form on the GaAS surface lens means of $SiO_2$, SiO, $Si_3N_4O$, GaAlO, $Al_2O_3$, $GaO_xN_y$ or a dielectric of a mixture of them. Such a lens is formed on a light emitting diode or a photo diode to perform a light collecting operation, by which the signal transfer efficiency can be improved. Of course, it is also effective to interconnect in parallel many chips between their predetermined two locations by means of optical fibers. The coupling by light need not always be achieved on the peripheral portions of the chips but it is desirable to provide input and output terminals at optimum positions where the most efficiently is obtained. For connecting many chips, such an arrangement may also be made that the light receiving photo diode of each chip is disposed at the position corresponding to the light emitting diode acting as the output terminal of another chip. It is also possible to provide the light receiving diode on one side of each chip and the light emitting diode on the other side. For example, by arranging the chips in a staggered relationship to adjacent ones of them, a large number of chips can be actuated by photo coupling.

Figure 6A:
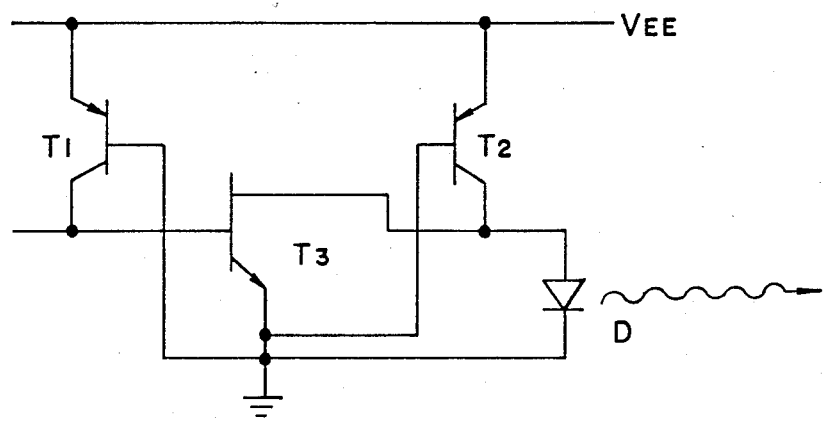
FIG. 6 shows another embodiment of this invention in which a light emitting diode is provided at an output part, FIG. 6A being an equivalent circuit diagram and FIG. 6B a sectional view of this embodiment.
Figure 6B:
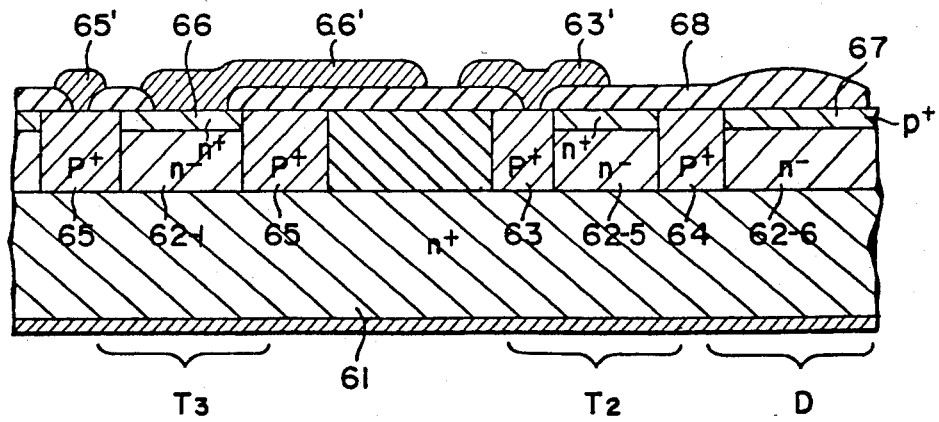

FIGS. 6A and 6B show an example in which a light emitting diode is disposed at the output terminal portion and FIGS. 7A to 7D show an example in which a photo diode is formed at the input terminal portion. In FIG. 6, reference characters $T_1$ and $T_2$ indicate bipolar transistors connected as loads; $T_3$ designates a driver SIT; and D identifies a light emitting diode. The bipolar transistor $T_1$ is a load transistor of a preceding stage and a stage having a light output is made up of the transistors $T_2$ and $T_3$ and the diode D. When the transistor $T_3$ is in its cut-off state, its drain is at a high level, so that a current flowing in the load transistor $T_2$ is fed to the light emitting diode D to emit light. When the SIT is conductive, the potential at its output terminal becomes low-level, with the result that no current flows in the light emitting diode and hence no light is emitted therefrom. In other words, the light emitting diode D emit or does not emit light in dependence on whether the output from the SIT $T_3$ is high- or low-level. Where the driver transistor $T_3$ of SITL is formed with an n channel junction SIT, as in the case of FIG. 6A, then its gate region becomes p type naturally. Hence, a main electrode of an injector (load) transistor merged into the gate is a p type region. If an n type region is formed adjacent such a p type region to provide a diode, a light output can be derived from any stage of a logical circuit. It will be seen that the anode of the diode can be electrically connected to the next stage. FIG. 6B shows an example of an integrated structure of the transistors $T_2$ and $T_3$ and the diode D in FIG. 6A, which constitute a logical unit. In FIG. 6B, reference numeral 61 indicates an $n^+$ substrate; 62 designates an $n^-$ type epitaxial growth layer; 63 identifies an emitter region of the transistor $T_3$; 64 denotes a collector region of the transistor $T_2$; 65 represents a gate region of the transistor $T_3$; 66 shows a drain region of the transistor $T_3$; 67 refers to a $p^+$ region of the light emitting diode D; 68 indicates an insulating layer; 63' designates an emitter electrode; 65' identifies a gate electrode of the SIT; and 66' denotes a drain electrode. The $p^+$ region 64 is connected via the drain electrode 66' to the drain region 66. It is because of a small diffusion potential difference between the $p^+$ and $n^-$ type regions that substantially no forward current flows between the $p^+$ and $n^+$ regions 63 and 61 but that a current flows in the route (p+ region 67 - n− type epitaxial growth layer 62 - n+ type substrate 61).

In order to further facilitate flowing of a current in the light emitting diode, it is sufficient only to lower the impurity concentration of the region 62 defined between the p+ and n+ regions 67 and 61. In the case of using a substance that provides a great difference in mobility between electrons and holes, such as gallium arsenide, electrons of high mobility play the principal part in injection. Accordingly, the region 62 between the p+ and n+ regions 67 and 61 may also be a p type high resistivity region, not n− type shown. The intermediate layer 62 as portions 62-1, 62-5 and 62-6, the portion 52-6 lying between regions 67 and 61. It is effective, of course, to make the power source voltage only at the output stage a little higher than the other parts so as to facilitate a current flow. Needless to say, the output part need not always be a light emitting diode but may also be a semiconductor laser.

Figure 7A:
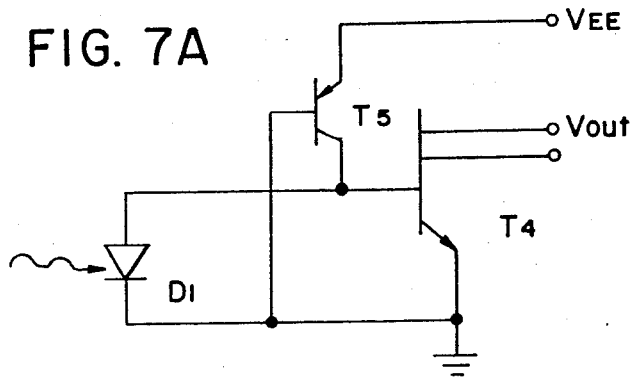
FIG. 7 illustrates another embodiment of this invention, FIG. 7A being an equivalent circuit diagram, FIG. 7B being its plan view and FIGS. 7C and 7D sectional views respectively taken on the lines VIIC—VIIC' and VIID—VIID' in FIG. 7B.
Figure 7B:
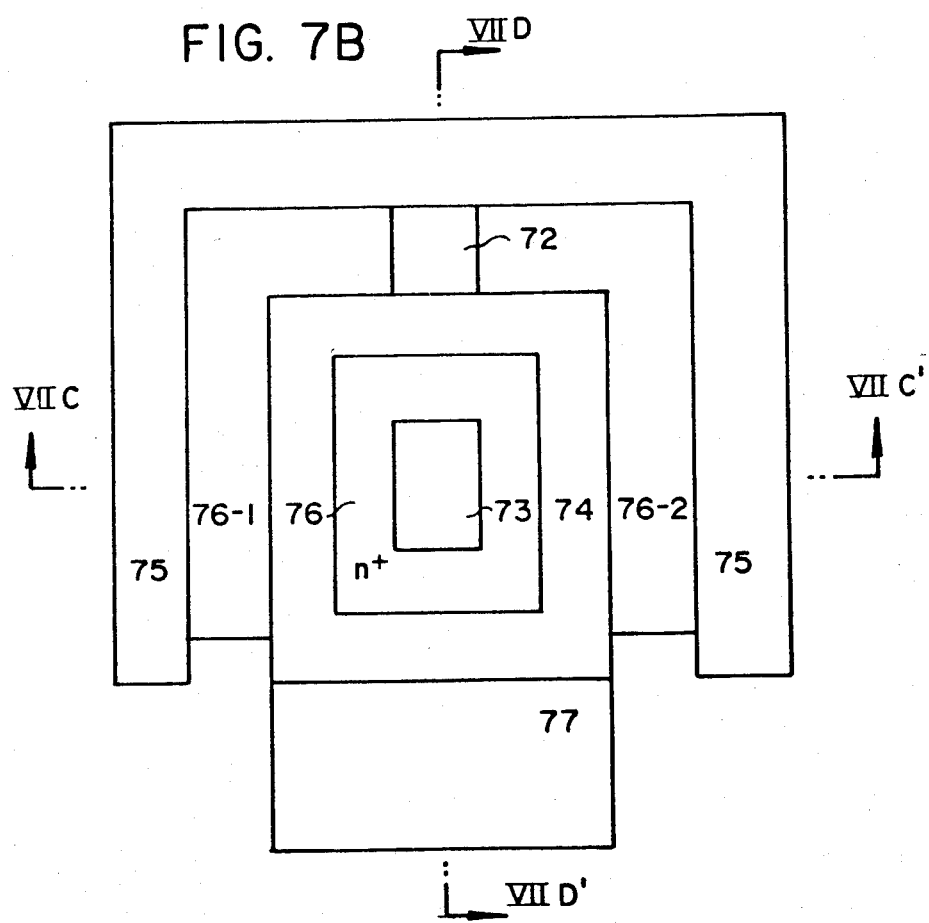
Figure 7C:
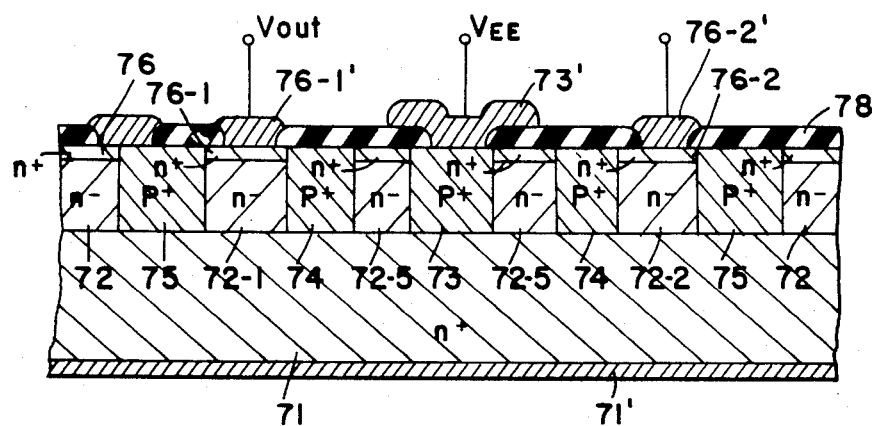
Figure 7D:
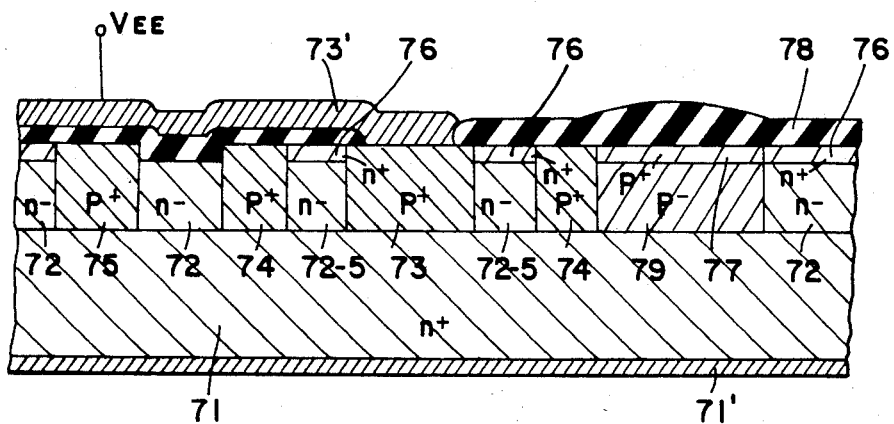

In FIG. 7A, reference character $T_4$ indicates a driver SIT; $T_5$ designates a load bipolar transistor; and $D_1$ identifies a photo diode serving as a photo detector. When no light is incident on the photo diode $D_1$, the gate of the transistor $T_4$ is at a high level and the transistor $T_4$ is conductive. Upon incidence of light on the photo diode $D_1$, a voltage across the diode $D_1$ drops to permit the passage therethrough of a current from the load transistor $T_5$, cutting off the transistor $T_4$. FIG. 7B is a plan view, FIGS. 7C and 7D are sectional views respectively taken on the lines VIIC—VIIC' and VIID—VIID' in FIG. 7B. This example is substantially identical in basic construction with the example of FIG. 6. In FIGS. 7B to 7D, reference character 71 indicates an n+ substrate; 72 designates an n− epitaxial growth layer; 73 identifies an emitter region of the load transistor; 74 denotes a region serving both as a collector region of the load transistor and a driving gate region of the driver SIT; 75 represents a non-driving gate region of the driver SIT; 76-1 and 76-2 show a drain region of the SIT; 77 refers to a p+ region of the photo diode; 78 designates an insulating layer; 73' identifies an emitter electrode; and 76-1' and 76-2' denote drain electrodes. A region 79 is a p− type high resistivity region for enhancement of the light receiving efficiency, as described previously. If the region 79 is made n− type as in the case of the diode D shown in FIG. 6B, the manufacturing process is simple. In the present example, the photo diode is connected in forward direction but, of course, it may also be connected in backward direction. Portions 72-1, 72-2 and 72-5 of the intermediate layer 72 lie under portions of the surface layer 76.

Figure 8:
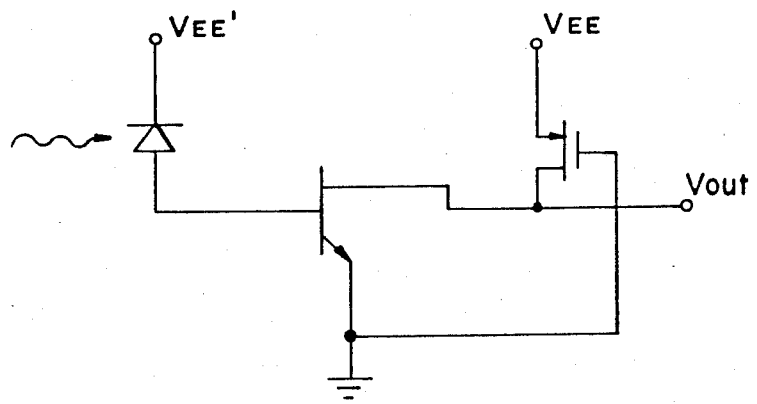
FIG. 8 shows another embodiment of this invention which operates on a light input.

FIG. 8 illustrates a modified form of the example of FIG. 7 in which the photo diode is connected in a backward direction and used as a light input part. In this example, the load transistor is an IGFET. A light input Pin is applied to the photo diode in a reverse biased condition. Upon incidence of light on the photo diode, a current flows therein, so that the gate of the SIT is charged up to a predetermined potential to make the SIT conducting. Upon extinction of the incidence of light, the current supply to the gate of the SIT is stopped and the gate potential returns to its low level to cut off the SIT. By combining this construction with that of FIG. 6, a photo inverter is obtained. The power source voltage $V_{EE}'$ depends on the characteristic of the photo diode and is usually higher than $V_{EE}$.

Figure 9:
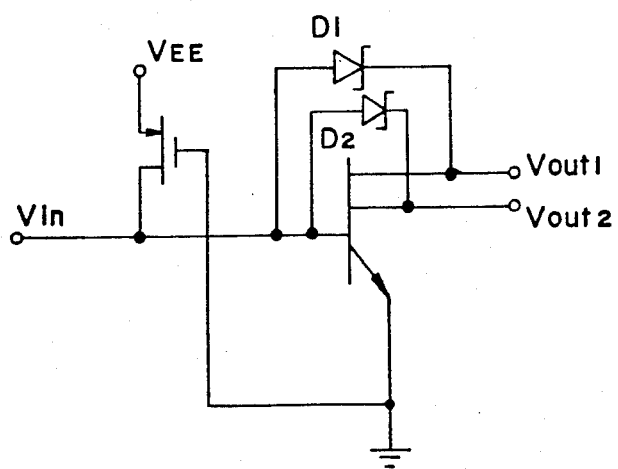
FIG. 9 shows an equivalent circuit diagram of another embodiment of this invention.

When the SIT performing the function of an inverter is biased between its gate and drain too deeply in the forward direction, the operating speed is decreased. For improvement of the operating speed, it is undesirable to bias the SIT between its gate and drain too deeply in the forward direction such, for example, that the gate voltage is 0.8 to 1.1 V at the high level and the drain is 0.2 V at the low level. In order that the voltage difference between the gate and drain may be not so large, Schottky diodes $D_1$ and $D_2$ are inserted between the gate and drain of the SIT, as depicted in FIG. 9. In the example of FIG. 9, the load transistor is a MOSFET. Letting $V_f$ represent a forward drop voltage of the Schottky diode, the voltage difference between the high and low level does not exceed $V_f$. The Schottky diode can be formed by vapor deposition or plating of Al, Pt, Pd or like metal. Such a Schottky diode is provided at one portion of the surface of the p+ gate region of the inverter SIT and directly connected with the drain through an electrode. Alternatively, the Schottky diode is formed at one part of the drain and connected with the gate region. In a GaAs device, the barrier height of a Schottky junction in an n type region is usually larger than the barrier height of a Schottky junction in a p type region. Consequently, in the case of reducing the voltage difference between the high and low levels, the Schottky junction is provided in the p+ gate region, whereas in the case of requiring a little large voltage difference the Schottky junction is formed in the n+ drain region.

While the present invention has been described above in connection with the GaAs semiconductor device constructed using a dual epitaxial layer, a further multi-layer structure can also be employed. For example, it is also possible to from n and p+ layers on the p+ type gate region of the load transistor by epitaxial growth and to combine them with the p+ type gate region, thereby to provided a pnp bipolar transistor which is used as an injector (load) transistor.

In the I²L equivalent SITL using the GaAs SIT according to this invention, the recombination rate of minority carriers injected into the channel is high and the storage effect is small since gallium arsenide has high mobility of electrons and a direct transistion characteristic; therefore, the GaAs I²L equivalent SITL is of particular utility when employed in the case of a high-speed operation is required, and can be manufactured by the present fabrication techniques and hence is very valuable from the industrial point of view.

It will be apparent that many modifications and variations may be effected without departing from the scope of novel concepts of this invention.

What is claimed is:
1. A GaAs semiconductor device, comprising:
   an n type GaAs layer of low resistivity;
   an n type intermediate GaAs layer of high resistivity overlying said n type layer;
   an n type GaAs surface layer of low resistivity overlying said n type intermediate layer;
   a first p type GaAs region of low resistivity having a through hole path therein, extending from the surface of said n type surface layer at least into said n type intermediate layer, surrounding a first portion of each of said n type surface layer and said n type intermediate layer and defining a continuous n type current path between said n type layer and said first portion of the n type surface layer;
   the first portion of said n type intermediate layer having such dimensions that the built-in voltage of the pn junction with the first p type region established a depletion layer therein to produce a poten- tial barrier for electrons in said continuous n type current path without any external bias applied to said first p type region;

a second p type GaAs region of low resistivity located in said n type intermediate layer in the neighborhood of said first p type region and sandwiching a second portion of said n type intermediate layer therebetween;

the n type layer, the first portions of the n type intermediate layer and the n type surface layer and the first p type region constituting a source, a channel, a drain and a gate of an n channel static induction transistor;

the second p type region, the second portion of the n type intermediate layer of the first p type region constituting an emitter, a base and a collector of a pnp bipolar transistor.

2. A GaAs semconductor device comprising:

an n type layer of low resistivity overlying said n type layer of low resistivity;

an n type GaAs surface layer of low resistivity overlying said n type intermediate layer;

a first p type GaAs region of low resistivity having a through hole path therein, extending from the surface of said n type surface layer at least into said n type intermediate layer, surrounding a first portion of each of said n type surface layer and said n type intermediate layer and defining a continuous n type current path between said n type layer and said first portion of the n type surface layer;

the first portion of said n type intermediate layer having such dimensions that the built-in voltage of the pn junction with the first p type region establishes a depletion layer therein to produce a potential barrier for electrons in said continuous n type current path without any external bias applied to said first p type region; and a second p type GaAs region of low resistivity located in said n type intermediate layer in the neighborhood of said first p type region and sandwiching a second portion of said n type intermediate layer therebetween;

the n type layer, the first portions of the n type intermediate layer and the n type surface layer and the first p type region constituting a source, a channel, a drain and a gate of an n channel static induction transistor, the second p type region, the second portion of the n type intermediate layer and the first p type region constituting an emitter, a base and a collector of a pnp bipolar transistor;

a photodiode for converting a light signal into an electrical signal, including a p type anode region electrically connected to at least one p type region and an n type cathode region located adjacent to and forming a pn junction with said anode region and adapted to be supplied with a positive bias voltage.

3. A GaAs semiconductor device, comprising:

a n type GaAs layer of low resistivity;

a n type intermediate GaAs layer of high resistivity overlying said n type layer;

a n type GaAs surface layer of low resistivity overlying said n type intermediate layer;

a first p type GaAs region of low resistivity having a through hole path therein, extending from the surface of said n type surface layer at least into said n type intermediate layer surrounding a first portion of each of said n type surface layer and said n type intermediate layer and defining a continuous n type current path between said n type layer and said first portion of the n type surface layer;

the first portion of said n type intermediate layer having such dimensions that the built-in voltage of the pn junction with the first p type region establishes a depletion layer therein to produce a potential barrier for electrons in said continuous n type current path without any external bias applied to said first p type region, a second p type GaAs region of low resistivity located in said n type intermediate layer in the neighborhood of said first n type region and sandwiching a second portion of said n type intermediate layer therebetween;

an insulated electrode structure formed on said second portion of the n type intermediate layer;

the n type layer, the first portions of the n type intermediate layer and the n type surface layer and the first p type region constituting a source, a channel, a drain and a gate of an n channel static induction transistor, the second p type region, the second portion of the n type intermediate layer, the first p type region and the insulated electrode structure constituting a source, a channel, a drain and an insulated gate electrode of an insulated gate field effect transistor.

4. A GaAs semiconductor device, comprising:

an n type GaAs layer of low resistivity;

an n type intermediate GaAs layer of high resistivity overlying said n type layer;

an n type GaAs surface layer of low resistivity overlying said n type intermediate layer;

a first p type GaAs region of low resistivity having a through hole path therein, extending from the surface of said n type surface layer at least into said n type intermediate layer, surrounding a first portion of each of said n type surface layer and said n type intermediate layer and defining a continuous n type current path between said n type layer and said first portion of the n type surface layer;

the first portion of said n type intermediate layer having such dimensions that the built-in voltage of the pn junction with the first p type region establishes a depletion layer therein to produce a potential barrier for electrons in said continuous n type current path without any external bias applied to said first p type region, a second p type GaAs region of low resistivity located in said n type intermediate layer in the neighborhood of said first n type region and sandwiching a second portion of said n type intermediate layer therebetween;

an insulated electrode structure formed on said second portion of the n type intermediate layer;

the n type layer, the first portions of the n type intermediate layer and the n type surface layer and the first p type region constituting a source, a channel, a drain and a gate of an n channel static induction transistor, the second p type region, the second portions of the n type intermediate layer, the first p type region and the insulated electrode structure constituting a source, a channel, a drain and an insulated gate electrode of an insulated gate field effect transistor; and a photodiode for converting a light into an electrical signal, including a p type anode region electrically connected to at least one p type region and an n type cathode region located adjacent to and forming a pn junction with said anode region and adapted to be supplied with a positive bias voltage.

5. A GaAs semiconductor device, comprising:

an n type GaAs layer of low resistivity;

an n type intermediate GaAs layer of high resistivity overlying said n type layer;

an n type GaAs surface layer of low resistivity overlying said n type intermediate layer;

a first p type GaAs region of low resistivity having a through hole path therein, extending from the surface of said n type surface layer at least into said n type intermediate layer, surrounding a first portion of each of said n type surface layer and said n type intermediate layer and defining a continuous n type current path between said n type layer and said first portion of the n type surface layer;

the first portion of said n type intermediate layer having such dimensions that the built-in voltage of the pn junction with the first p type region establishes a depletion layer therein to produce a potential barrier for electrons in said continuous n type current path without any external bias applied to said first p type region, a second p type GaAs region of low resistivity located in said n type intermediate layer in the neighborhood of said first p type region and sandwiching a second portion of said n type intermediate layer therebetween;

the n type layer, the first portions of the n type intermediate layer and the n type surface layer and the first p type region constituting a source, a channel, a drain and a gate of an n channel statis induction transistor, the second p type region, the second portion of the n type intermediate layer and the first p type region constituting an emitter, a base and a collector of a pnp bipolar transistor; and a semi-insulating GaAs region formed by ion bombardment and surrounding said n channel static induction transistor and said bipolar transistor therein.

* * * * *